(12) United States Patent
Satoh et al.

(10) Patent No.: US 8,613,802 B2
(45) Date of Patent: Dec. 24, 2013

(54) NITRIDE SEMICONDUCTOR CRYSTAL MANUFACTURING APPARATUS, NITRIDE SEMICONDUCTOR CRYSTAL MANUFACTURING METHOD, AND NITRIDE SEMICONDUCTOR CRYSTAL

(75) Inventors: Issei Satoh, Itami (JP); Michimasa Miyanaga, Osaka (JP); Yoshiyuki Yamamoto, Itami (JP); Hideaki Nakahata, Itami (JP)

(73) Assignee: Sumitomo Electric Industies, Ltd., Osaka (JP)

( * ) Notice: Subject to any disclaimer, the term of this patent is extended or adjusted under 35 U.S.C. 154(b) by 6 days.

(21) Appl. No.: 13/060,276

(22) PCT Filed: Jan. 20, 2010

(86) PCT No.: PCT/JP2010/050583
§ 371 (c)(1),
(2), (4) Date: Feb. 23, 2011

(87) PCT Pub. No.: WO2010/084863
PCT Pub. Date: Jul. 29, 2010

(65) Prior Publication Data
US 2011/0171462 A1    Jul. 14, 2011

(30) Foreign Application Priority Data

Jan. 23, 2009 (JP) ................................ 2009-013410
Jan. 6, 2010 (JP) ................................ 2010-001192

(51) Int. Cl.
*C30B 23/06* (2006.01)

(52) U.S. Cl.
USPC .......... 117/200; 117/84; 117/204; 252/518.1; 252/521.6; 252/584; 257/615; 257/E33.025; 257/E33.028; 257/E33.033; 118/715; 118/719; 118/722; 118/724; 118/726; 118/733

(58) Field of Classification Search
USPC ................. 117/84, 200, 204, 952; 252/518.1, 252/521.6, 584; 257/615, E33.025, 257/E33.028, E33.03, E33.033; 118/715, 118/719, 722, 724, 726, 733
See application file for complete search history.

(56) References Cited

U.S. PATENT DOCUMENTS

2005/0009310 A1    1/2005 Vaudo et al.
(Continued)

FOREIGN PATENT DOCUMENTS

EP       1852528 A1    11/2007
(Continued)

OTHER PUBLICATIONS

R. Schlesser, et al. publication entitled "Growth of bulk AlN crystals by vaporization of aluminum in a nitrogen atmosphere," Journal of Crystal Growth, vol. 234, pp. 349-353 (2002).*

(Continued)

*Primary Examiner* — Michael Kornakov
*Assistant Examiner* — Kenneth A Bratland, Jr.
(74) *Attorney, Agent, or Firm* — James W. Judge

(57) ABSTRACT

Affords nitride semiconductor crystal manufacturing apparatuses that are durable and that are for manufacturing nitride semiconductor crystal in which the immixing of impurities from outside the crucible is kept under control, and makes methods for manufacturing such nitride semiconductor crystal, and the nitride semiconductor crystal itself, available. A nitride semiconductor crystal manufacturing apparatus (100) is furnished with a crucible (101), a heating unit (125), and a covering component (110). The crucible (101) is where, interiorly, source material (17) is disposed. The heating unit (125) is disposed about the outer periphery of the crucible (101), where it heats the crucible (101) interior. The covering component (110) is arranged in between the crucible (101) and the heating unit (125). The covering component (110) includes a first layer (111) formed along the side opposing the crucible (101), and made of a metal whose melting point is higher than that of the source material (17), and a second layer (112) formed along the outer periphery of the first layer (111), and made of a carbide of the metal that constitutes the first layer (111).

3 Claims, 8 Drawing Sheets

(56) References Cited

U.S. PATENT DOCUMENTS

| | | | |
|---|---|---|---|
| 2006/0005763 A1* | 1/2006 | Schowalter et al. | 117/95 |
| 2007/0256630 A1* | 11/2007 | Wang | 117/952 |
| 2011/0265709 A1* | 11/2011 | Satoh et al. | 117/84 |

FOREIGN PATENT DOCUMENTS

| | | |
|---|---|---|
| EP | 2390386 A1 | 11/2011 |
| JP | H03-228890 A | 10/1991 |
| JP | 2006-027988 A | 2/2006 |
| JP | 2006-511432 A | 4/2006 |
| JP | 2007-500664 A | 1/2007 |
| JP | 2007-534580 A | 11/2007 |
| JP | 2008-024580 A | 2/2008 |
| JP | 2008-535757 A | 9/2008 |

OTHER PUBLICATIONS

Chapter 2 on Thermal Expansion in a publication titled "ASM Ready Reference: Thermal Properties of Metals," published by ASM International, Materials Park, OH, accessed on Nov. 14, 2012.*

Glen A. Slack et al., "Growth of High Purity AlN Crystals," Journal of Crystal Growth, Jul. 1976, pp. 263-279, vol. 34, Issue 2, North-Holland Publishing Company, NL.

R. Schlesser et al., "Growth of Bulk AlN Crystal by Vaporization of Alminum in a Nitrogen Atmosphere," Journal of Crystal Growth, Jan. 2002, pp. 349-353, vol. 234, Issue 2-3, Elesevier, NL.

* cited by examiner

NITRIDE SEMICONDUCTOR CRYSTAL MANUFACTURING APPARATUS, NITRIDE SEMICONDUCTOR CRYSTAL MANUFACTURING METHOD, AND NITRIDE SEMICONDUCTOR CRYSTAL

TECHNICAL FIELD

The present invention relates to apparatuses for manufacturing nitride semiconductor crystal, to methods for manufacturing nitride semiconductor crystal, and to nitride semiconductor crystals.

BACKGROUND ART

Aluminum nitride (AlN) crystal has a wide energy bandgap of 6.2 eV and a high thermal conductivity of approximately 3.3 $WK^{-1} cm^{-1}$, and has high electrical resistance as well. AlN crystal and other nitride semiconductor crystals have therefore drawn attention as substrate materials for semiconductor devices such as optical devices and electronic devices. For the method whereby such nitride semiconductor crystal is grown, sublimation method, for example, is employed (e.g., Patent Reference 1, Non-Patent Reference 1).

Non-Patent Reference 1 sets forth implementing the following steps. At first an AlN crystal source material is emplaced into a crucible made of carbon. Next, the carbonous crucible is heated to a temperature at which the source material sublimes. By subliming the source material the heating generates sublimation gases, enabling the growth of minute AlN crystal at a powdered or particulate level.

Meanwhile, Patent Reference 1 sets forth manufacturing nitride single crystal by means of the following manufacturing apparatus (e.g., FIG. 4). Namely, the manufacturing apparatus is furnished with an induction heating coil that is a heating means, a heating reactor body disposed to the inside of the induction heating coil, and a crucible, disposed in the lower part of the interior of the heating reactor body, that holds nitride single-crystal source material. The crucible is stated to be made of graphite.

Thus, the above-cited Non-Patent Reference 1 and Patent Reference 1 set forth that in growing nitride semiconductor crystal, a carbonous crucible is employed. Withstanding high temperatures in excess of 2000° C. is stated as the reason why carbon is chosen for the crucible.

CITATION LIST

Patent Literature

Patent Reference 1: Japanese Unexamined Pat. App. Pub. No. 2006-27988

Non Patent Literature

Non-Patent Reference 1: *Journal of Crystal Growth* 34, pp. 263-279 (1976)

Technical Problem

In sublimation method it is necessary to heat the crucible so as to sublime the source material for the nitride semiconductor crystal. Apparatuses for manufacturing nitride semiconductor crystal therefore require the durability to at least withstand high temperatures.

Again, as a material that withstands high temperatures, in crucibles carbon as noted in above-cited Non-Patent Reference 1 and Patent Reference 1 is employed. For the same reason, a heating element and a heat insulator made of carbon are generally arranged about the outer periphery of the crucible. In an environment where a carbonous heating element and heat insulator are installed, when the crucible is heated so as to sublime the source material for the nitride semiconductor crystal, the heating element and heat insulator arranged about the outer periphery of the crucible can become sublimed as well. In that case, the sublimed carbon invades the interior of the crucible, mixing into the nitride semiconductor that is grown. A consequent problem has been that impurities are mixed into the grown nitride semiconductor crystal.

Accordingly, the present invention affords nitride semiconductor crystal manufacturing apparatuses that are durable and that are for manufacturing nitride semiconductor crystal in which the immixing of impurities from outside the crucible is kept under control, and makes methods for manufacturing the nitride semiconductor crystals, and the nitride semiconductor crystals, available.

Solution to Problem

A nitride semiconductor crystal manufacturing apparatus of the present invention is an apparatus whereby a nitride-semiconductor-containing source material is sublimed and nitride semiconductor crystal is grown by the deposition of the sublimed source-material gases, and is furnished with a crucible, a heating unit, and a covering component. The crucible is where, interiorly, source material is disposed. The heating unit is disposed about the outer periphery of the crucible, where it heats the crucible interior. The covering component is arranged in between the crucible and the heating unit. The covering component includes a first layer formed along the component where it opposes the crucible, and made of a metal whose melting point is higher than that of the source material, and a second layer formed along the outer periphery of the first layer, and made of a carbide of the metal that constitutes the first layer.

A nitride semiconductor crystal manufacturing method of the present invention is provided with the following steps. A crucible for interiorly carrying source material, and a covering component arranged about the outer periphery of the crucible are prepared. Within the crucible, heating of the source material sublimes the source material, and by the deposition of source-material gases caused, nitride semiconductor crystal is grown. The preparation step includes an operation that prepares the covering component including a first layer formed along the component where it opposes the crucible, and made of a metal whose melting point is higher than that of the source material, and a second layer formed along the outer periphery of the first layer, and made of a carbide of the metal that constitutes the first layer.

In accordance with a nitride semiconductor crystal manufacturing apparatus and manufacturing method of the present invention, a covering component is arranged about the outer periphery of the crucible. Impurities may thereby be kept from invading the crucible interior from its exterior.

Furthermore, the first layer in the covering component, formed along where it opposes the crucible, is made of a metal whose melting point is higher than that of the source material. Subliming of the covering component at the temperatures at which the source material sublimes may thereby be kept under control. Still further, the metal's reactivity with the sublimation gases is low. Reacting of the first layer, located on the inner periphery of the covering component, with the sublimation gases may thereby be controlled to a minimum. Impurities may therefore be kept from invading the crucible from the covering component. In sum, invasion of impurities from the exterior to the interior of the crucible may be kept under control, while generation of impurities from the first layer, located on the side of the covering component where it opposes the crucible, may be kept under control. Accordingly, immixing of impurities from the crucible exterior into the nitride semiconductor crystal that is grown may be kept under control. Thus, nitride semiconductor crystal in which immixing of impurities has been controlled to a minimum can be manufactured.

Additionally formed about the outer periphery of the covering component is the second layer, which contains the metal constituting the first layer, and carbon. In implementations in which the heating element, heat insulator, and like components arranged about the outer periphery of the covering component contain carbon, the second layer mitigates difference in thermal expansion coefficient with carbon, as well as difference in thermal expansion coefficient with the first layer. Occurrences of cracking in the covering component may therefore be kept under control. Accordingly, nitride semiconductor crystal can be grown with breakage of the covering component being controlled to a minimum, even under the high-temperature conditions for subliming the source material. Thus, nitride semiconductor crystal can be manufactured with the durability being improved.

In the nitride semiconductor crystal manufacturing apparatus described above, preferably the crucible is made of a metal whose melting point is higher than that of the source material.

In the above-described nitride semiconductor crystal manufacturing method, preferably the preparation step further includes an operation of preparing the crucible made of a metal whose melting point is higher than that of the source material.

Subliming of the crucible at the temperatures at which the source material sublimes may thereby be kept under control. Further, the metal's reactivity with the sublimation gases is low. Immixing of the material constituting the crucible into the nitride semiconductor crystal that is grown may therefore be controlled to a minimum. Accordingly, nitride semiconductor crystal in which immixing of impurities has been further minimized can be manufactured.

In the above-described nitride semiconductor crystal manufacturing apparatus, preferably the heating unit is an RF (radio-frequency) coil, wherein the apparatus is further furnished with a heating element arranged in between the covering component and the heating unit.

In the nitride semiconductor crystal manufacturing method described above, preferably the preparation step further includes an operation of arranging a heating element about the outer periphery of the covering component, and an operation of arranging about the outer periphery of the heating element an RF coil for heating the heating element.

Causing the heat generated through the RF coil to be absorbed by the heating element arranged about the outer periphery of the crucible enables the crucible to be heated by the heat that the heating element has absorbed. The source material can thereby be sublimed. Accordingly, nitride semiconductor crystal in which the immixing of impurities has been controlled to a minimum can be manufactured, in an environment having durability.

The nitride semiconductor crystal manufacturing apparatus described above preferably is further furnished with a heat insulator, disposed in between the heating element and the RF coil, and consisting of a material that is less porous than the heating element is.

In the above-described nitride semiconductor crystal manufacturing method preferably the preparation step further includes an operation of arranging about the outer periphery of the heating element a heat insulator consisting of a material that is less porous than the heating element is.

The fact that a heat insulator consisting of a material that is less porous than the heating element is arranged about the outer periphery of the heating element makes it possible to keep the heat that the heating element has absorbed from escaping to the heat insulator exterior. The crucible can thereby be heated efficiently. Accordingly, nitride semiconductor crystal in which the immixing of impurities has been minimized can be manufactured, in an environment having durability.

Nitride semiconductor crystal of the present invention is manufactured by a nitride semiconductor crystal manufacturing method of any of the foregoing descriptions.

In accordance with nitride semiconductor crystal of the present invention, since the crystal is manufactured with invading of impurities from the crucible exterior being kept under control, nitride semiconductor crystal in which the mixing-in of impurities has been controlled to a minimum can be realized.

The above-described nitride semiconductor crystal preferably has a diameter of at least 10 mm, and has an impurity concentration of not greater than 2 ppm.

The aforedescribed nitride semiconductor crystal is manufactured by sublimation method, which makes it possible to realize crystals having a large diameter of 10 mm or more. And since it is manufactured with invading of impurities from the crucible exterior being kept under control, nitride semiconductor crystal of low, 2 ppm or less, impurity concentration can be realized. Accordingly, nitride semiconductor crystal of large surface area and low impurity concentration can be realized.

Advantageous Effects of Invention

From the foregoing, in accordance with a nitride semiconductor crystal manufacturing apparatus and manufacturing method of the present invention, a covering component that includes, formed along its inner periphery, a first layer made of a metal whose melting point is higher than that of the source material, and, formed along the outer periphery of the first layer, a second layer made of a carbide of the metal that constitutes the first layer is arranged about the outer periphery of the crucible. Thus, nitride semiconductor crystal can be manufactured where there is durability, and in which the immixing of impurities from outside the crucible is kept under control.

DESCRIPTION OF EMBODIMENTS

Figure 1:
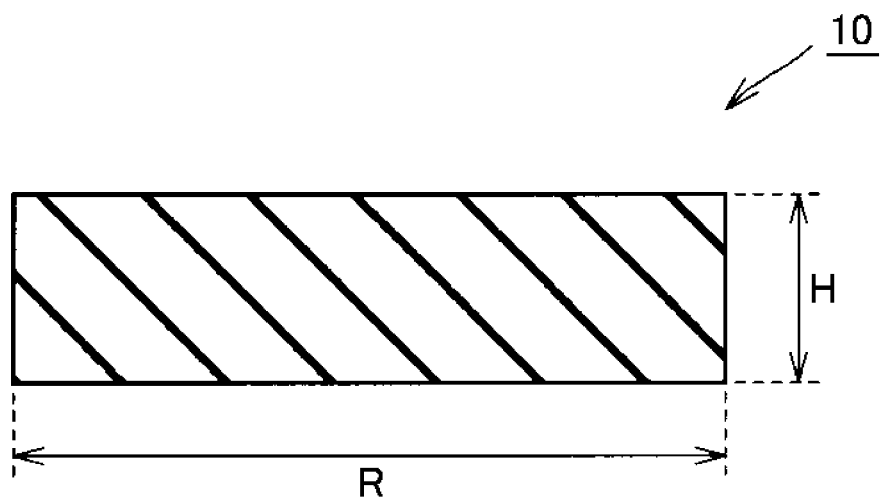
FIG. 1 is a sectional diagram representing, in a simplified form, a nitride semiconductor crystal in a mode of embodying the present invention.

Below, a description of modes of embodying the present invention will be made based on the drawings. It should be understood that in the following, identical or corresponding parts in the drawings are labeled with identical reference marks, and their description will not be repeated.

To begin with, referring to FIG. 1, an explanation of a nitride semiconductor crystal 10 in one mode of embodying the present invention will be made. The nitride semiconductor crystal 10 has a diameter R of, for example, at least 10 mm, preferably 10 mm to 30 mm, and a thickness H of, for example, at least 100 μm. The concentration of impurities in the nitride semiconductor crystal 10 is, for example, not greater than 2 ppm. The impurities constituting the impurity concentration include, for example, C (carbon) and S (silicon). The C concentration in the nitride semiconductor crystal 10 is, for example, not greater than 1 ppm, while the Si concentration is, for example, not greater than 1 ppm.

As long as it is a semiconductor crystal containing nitrogen (N), the nitride semiconductor crystal 10 is not particularly limited; exemplarily it is $In_{(1-x-y)}Al_xGa_yN$ ($0 \leq x \leq 1$, $0 \leq y \leq 1$, $0 \leq x+y \leq 1$), and preferably is AlN, GaN (gallium nitride), InN (indium nitride), etc.; more preferably the crystal is AlN.

Figure 2:
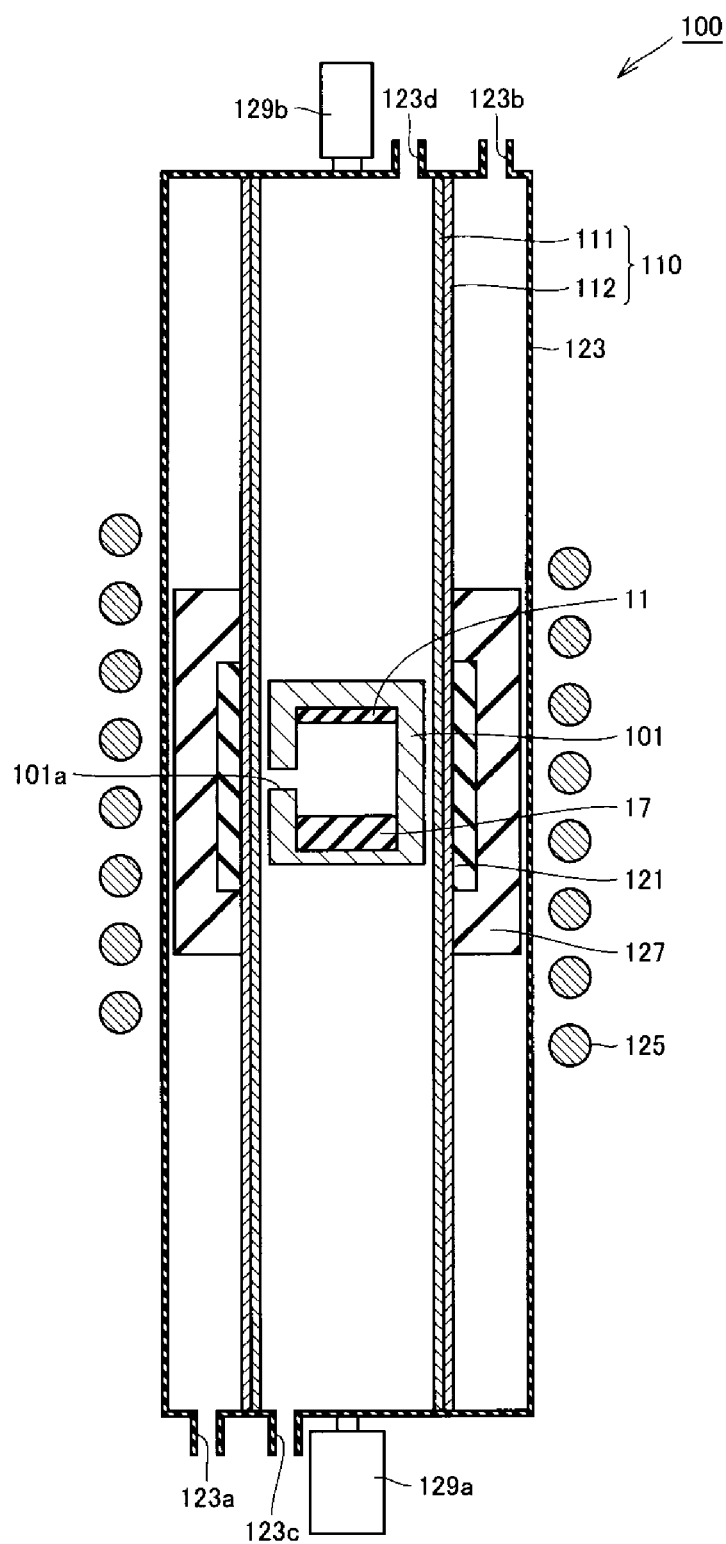
FIG. 2 is a sectional diagram representing, in a simplified form, a nitride semiconductor crystal manufacturing apparatus in a mode of embodying the present invention.
Figure 3:
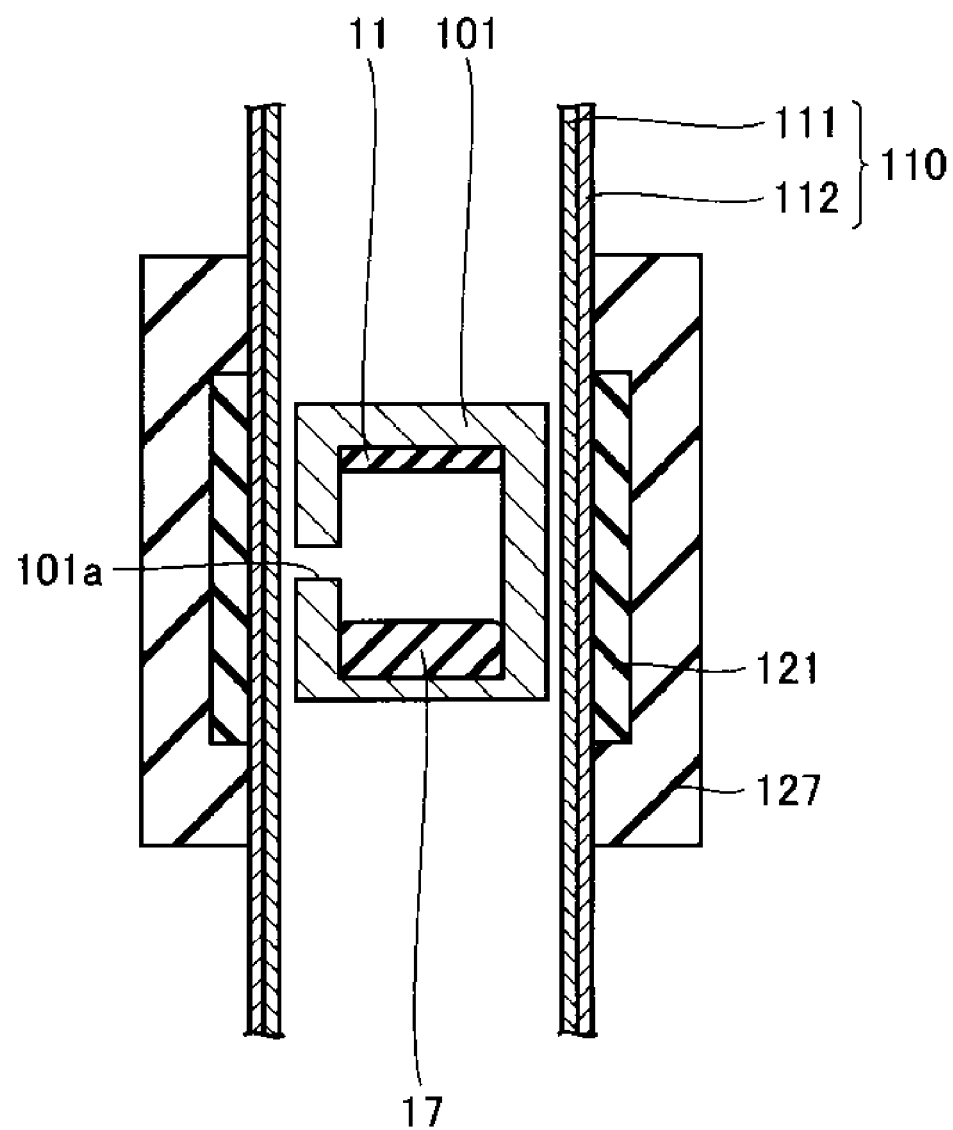
FIG. 3 is a sectional diagram representing, in a simplified form, a crucible and its environs, which the nitride semiconductor crystal manufacturing apparatus in a mode of embodying the present invention comprises.

To continue: Referring to FIGS. 2 and 3, an explanation of an apparatus 100, in one mode of embodying the present invention, for manufacturing nitride semiconductor crystal 10 will be explained. The manufacturing apparatus 100 is a device for growing nitride semiconductor crystal 10 by subliming a nitride-semiconductor-containing source material 17 to cause the sublimed source-material gases to deposit.

As indicated in FIGS. 2 and 3, the manufacturing apparatus 100 in the present embodying mode principally comprises a crucible 101, a covering sleeve 110 as a covering component, a heating element 121, a heat insulator 127, a reaction vessel 123, and a heating unit 125.

The crucible 101 is where, interiorly, a source material 17 and a template substrate 11 are set into place. The crucible 101 preferably is made of a metal whose melting point is higher than that of the source material 17. Such a metal may be, to cite examples, tantalum (Ta), tungsten (W) or rhenium (Re), as well as their alloys. In other words, the crucible 101 preferably does not contain C atoms. Subliming of the material constituting the crucible 101 at temperatures that sublime the source material 17 may thereby be curtailed. Furthermore, the metals' reactivity with the sublimation gases is low. Still further, such metals are advantageous because their emissivity is high, because their thermal resistance is high, and because they are industrially exploitable. Especially it is preferable that the crucible 101 be Ta, because its reactivity with nitride semiconductors is low, and it excels in thermal resistance at high temperatures. Herein, the aforementioned "melting point" signifies the melting point at 1 atmosphere.

The crucible 101 also has an exhaust port 101*a*. The exhaust port 101*a* exhausts impurities in the crucible 101 interior to the exterior of the crucible 101. Providing the crucible with the exhaust port 101*a* keeps abnormal growth under control, making it possible to grow monocrystalline nitride semiconductor crystal with ease.

Encompassing the crucible 101, the covering sleeve 110 is arranged so as to jacket the crucible 101.

In the present embodying mode, the covering sleeve 110 preserves ventilation of the reaction vessel 123 with the exterior through an inlet port 123*c* and an exhaust port 123*d* of the reaction vessel 123, and hermetically closes off the crucible 101 in the regions apart from there. In particular, the covering sleeve 110 is arranged spaced apart from the crucible 101, while other than at the inlet port 123*c* and exhaust port 123*d* the crucible 101 is sealed off by the covering sleeve 110 and the reaction vessel 123. In this way the covering sleeve 110 prevents impurities from invading the crucible 101 from the heating element 121, the heat insulator 127, the reaction vessel 123, etc. on the exterior of the covering sleeve 110.

Figure 8:
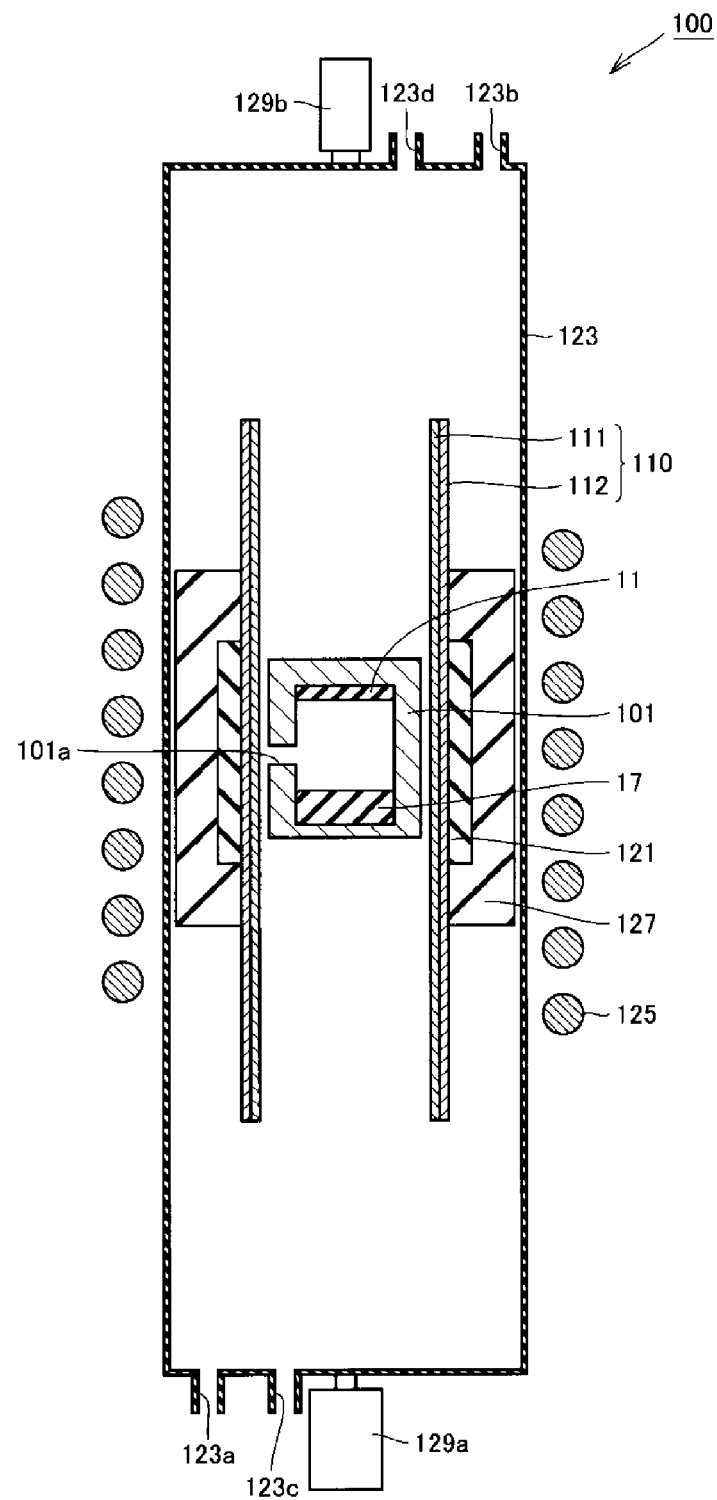
FIG. 8 is a sectional diagram representing, in a simplified form, a different apparatus, in a mode of embodying the present invention, for manufacturing nitride semiconductor crystal.

It should be noted that the covering sleeve 110 is not limited to the above-described structure that hermetically shuts off the crucible 101. That is, even if the covering sleeve 110 does not seal off the crucible 101, it will have the effect described above. For example, as illustrated in FIG. 8, the covering sleeve 110 may have openings on the upper and lower sides in the manufacturing apparatus 100. Likewise, the covering sleeve 110 may have an opening on either the upper side or the lower side in the manufacturing apparatus (not illustrated). In such implementations, by flowing gas into the interior of the covering sleeve 110, the same action as that of the above-described hermetically closed structure will operate, so that impurities may be prevented from invading the crucible 101 from the heating element 121, the heat insulator 127, the reaction vessel 123, etc. on the exterior of the covering sleeve 110.

The covering sleeve 110 includes a first layer 111 formed on the side opposing the crucible 101, and a second layer 112 formed along the outer periphery of the first layer 111. Hence, the first layer 111 is located on innermost periphery, while the second layer 112 is located on the outermost periphery, of the covering sleeve 110.

The first layer 111 is made of a metal whose melting point is higher than that of the source material. Such a metal may be, to cite examples, Ta, W or Re, as well as their alloys—likewise as with the material constituting the crucible 101. In particular, it is preferable that the component be made from Ta. The fact that Ta does not readily react with C allows the first layer 111 to minimize reactions with C that has sublimed. Therefore, even in instances where C has invaded the interior of the covering sleeve 110 through the inlet port 123*c*, and in implementations in which the crucible 101, the heating element 121, and the heat insulator 127 contain C and any of their carbon has invaded the covering sleeve 110 interior, it may be kept from reacting with the first layer 111. And even in cases where Si has invaded the covering sleeve 110 interior, such as in implementations in which the reaction vessel 123 contains Si, the first layer 111 may minimize reactions with Si having sublimed and invaded from the reaction vessel 123. The first layer 111 may be of the same material as that of the crucible 101, or it may be of a different material.

The second layer 112 is made from a carbide of the metal that constitutes the first layer 111. As examples of such metal carbides, TaC (tantalum carbide), WC (tungsten carbide) and ReC (rhenium carbide) as well as their alloys may be cited, with it being preferable that the component is made from TaC. The fractions (molar ratios) of the metal and C constituting the second layer 112 are not particularly limited; for example, the second layer 112 is formed so that they are 1:1.

The second layer 112 is formed, for example, by carbonizing the surface of the first layer 111 along its outer periphery. Alternatively, the covering sleeve 110 may be formed by forming the first layer 111 and then fitting the second layer 112 onto the first layer 111, covering its outer periphery.

The fraction of metal in the covering sleeve 110 monotonically decreases heading from the inner periphery to the outer periphery of the covering sleeve 110. Put differently, the fraction of C in the covering sleeve 110 increases monotonically heading from its inner periphery to its outer periphery.

Herein, the just-stated "monotonically decreases" means that heading from the inner periphery to the outer periphery of the covering sleeve 110, the metal fraction constantly is the same or decreases, and that the fraction in the outer peripheral face is lower than in the inner peripheral face. Put differently, with "monotonically decreases" no area where the metal fraction increases heading from the inner periphery to the outer periphery is included. And the just-stated "monotonically increases" means that heading from the inner periphery to the outer periphery of the covering sleeve 110, the C fraction constantly is the same or increases, and that the C fraction in the outer peripheral face is higher than in the inner peripheral face. Put differently, with "monotonically increases" no area where the C fraction decreases heading from the inner periphery to the outer periphery is included. Consequently, in that it has the just-stated conditions, the present invention includes implementations in which the border between the first layer 111 and the second layer 112 is distinct, and implementations in which it is not distinct.

In the covering sleeve 110, furthermore, the thermal expansion coefficient of the first layer 111 is larger than the thermal expansion coefficient of the second layer 112. Thus, the thermal expansion coefficient of the covering sleeve 110 monotonically decreases heading from its inner periphery to its outer periphery. Put differently, heading from the inner periphery to the outer periphery of the covering sleeve 110, the thermal expansion coefficient constantly is the same or decreases, with the thermal expansion coefficient in the outer peripheral face being lower than in the inner peripheral face. Difference in thermal expansion coefficient between the inner periphery and outer periphery of the covering sleeve 110 may be mitigated by the fact that the thermal expansion coefficient of C is smaller than the thermal expansion coefficient of Ta.

Here, the covering sleeve 110 may be formed with a third layer (not illustrated) in between the first layer 111 and the second layer 112. In that case, the third layer preferably is a carbide of the metal constituting the first layer 111, with its fraction (molar ratio) of metal being higher than that in the second layer 112. That is, it is preferable that the metal fraction decrease monotonically heading from the inner periphery to the outer periphery of the covering sleeve 110. In other words, it is preferable that the C fraction increase monotonically heading from the inner periphery to the outer periphery of the covering sleeve 110. It will be appreciated that the third layer may have a plurality of laminae.

The heating element 121 is disposed about the outer periphery of the covering sleeve 110, and in the present embodying mode is arranged contacting the covering sleeve 110. The heating element 121, a densified body, absorbs heat from the heating unit 125 and heats the interior of the crucible 101. The heating element 121 is made of graphite, for example. Carbon excels in heat resistance at high temperatures on the order of 2000° C., is capable of being heated by means of the RF coil, and is inexpensive.

For those reasons, the heating element 121 preferably contains C. It should be understood that the heating element 121 may be omitted.

The heat insulator 127 is disposed about the outer periphery of the heating element 121, and in the present embodying mode is arranged contacting the heating element 121 in such a way as to cover the entire outer periphery of the heating element 121. The heat insulator 127 is made of a material that is less porous (of lower porosity) than is the heating element 121. The heat insulator 127 keeps the heat that the heating element 121 has absorbed from escaping to the exterior. It will be appreciated that the heat insulator 127 itself does not readily absorb heat from the heating unit 125. The heat insulator 127 exemplarily contains C, from the standpoint of excelling in thermal resistance and being low-cost, and for example consists of carbon felt wrapped into a concentric circular form. It should be understood that the heat insulator 127 may be omitted.

Arranged encompassing the heat insulator 127 is the reaction vessel 123. The manufacturing apparatus 100 has inlet ports 123*a* and 123*c* that are formed on one end portion of the reaction vessel 123 (in the present embodying mode, the lower end) and that are for flowing a carrier gas such as gaseous nitrogen ($N_2$), for example, inside the reaction vessel 123, and it has exhaust ports 123*b* and 123*d* that are formed on the other end portion of the reaction vessel 123 (in the present embodying mode, the upper end) and that are for exhausting the carrier gas to the exterior of the reaction vessel 123. The inlet port 123*a* and the exhaust port 123*b* are disposed outside of the covering sleeve 110 within the reaction vessel 123. The inlet port 123*c* and the exhaust port 123*d* are disposed inside of the covering sleeve 110 within the reaction vessel 123. This means that the inlet port 123*c* flows carrier gas to the crucible 101 disposed inside the reaction vessel 123. And the exhaust port 123*d* exhausts carrier gas, impurities, etc. from the crucible 101 to the exterior of the reaction vessel 123. It should be understood that the reaction vessel 123 may be omitted.

The heating unit 125 is arranged about the outer periphery of the crucible 101, where it heats the interior of the crucible 101. Since the crucible 101 in the present embodying mode is positioned in the midportion of the reaction vessel 123 interior, the heating unit 125 is disposed in the midportion along the outer side of the reaction vessel 123. For the heating unit 125, an RF coil, a resistive heating coil, or the like can for example be utilized. Heat generated through the RF coil is not liable to be absorbed by metal.

Therefore, in implementations in which an RF coil is utilized as the heating unit 125, heating the heating element 121 heats the interior of the crucible 101. In implementations in which a resistive heating coil is utilized, the interior of the crucible 101 is heated directly. For that reason, in a case where a resistive heating coil is utilized as the heating unit 125, the heating element 121 and the heat insulator 127 may be omitted.

In addition, on its lower and upper portions the reaction vessel 123 is provided with pyrometers 129*a* and 129*b* for measuring the temperature of the top side of the crucible 101 (the temperature along the source material 17) and the temperature of the bottom side of it (the temperature along the template substrate 11). It should be understood that the pyrometers 129*a* and 129*b* may be omitted.

It will be appreciated that while the above-described manufacturing apparatus 100 may include various elements apart from those described, for convenience's sake in the description, illustration and explanation of such elements has been omitted.

To continue: An explanation of a method, in the present embodying mode, of manufacturing a nitride semiconductor crystal 10 will be made. In the present embodying mode, the nitride semiconductor crystal 10 is manufactured by sublimation method utilizing the manufacturing apparatus 100 illustrated in FIGS. 2 and 3.

At first, the crucible 101, as indicated in FIGS. 2 and 3, for interiorly carrying the source material 17, is prepared. The crucible 101 preferably is made of a metal whose melting point is higher than that of the source material 17. Next, the covering sleeve 110 is formed as the covering component jacketing the outer periphery of the crucible 101. The covering sleeve 110 includes the first layer 111, formed where the sleeve opposes the crucible 101 (along the sleeve's inner periphery) and made of a metal whose melting point is higher than that of the source material 17, and the second layer 112, formed along the outer periphery of the first layer 111 and made of a carbide of the metal that constitutes the first layer 111. The heating element 121 is then arranged about the outer periphery of the covering sleeve 110. Next, the heat insulator 127, constituted from a material that is less porous than is the heating element 121, is arranged about the outer periphery of the heating element 121. The reaction vessel 123 is then arranged about the outer periphery of the heat insulator 127. Thereafter the heating unit 125 is set into place encompassing the reaction vessel 123. In sum, referring to FIG. 4, the manufacturing apparatus 100 depicted in FIGS. 2 and 3 is prepared (Step S1) in the present embodying mode.

Figure 4:
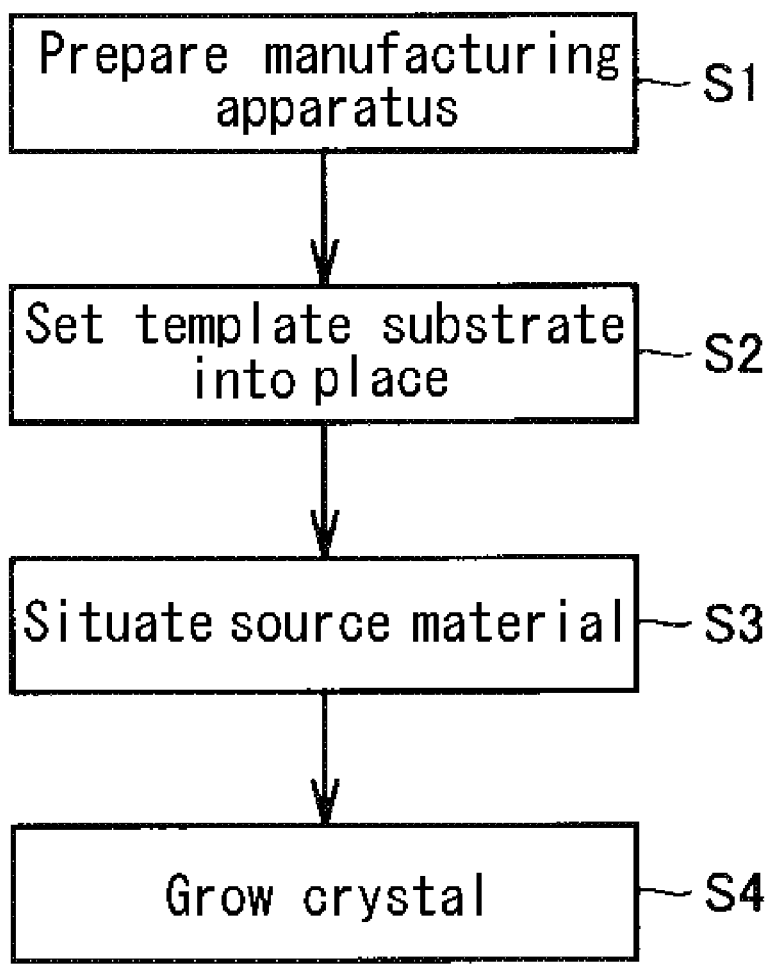
FIG. 4 is a flowchart setting forth a procedure, in a mode of embodying the present invention, for manufacturing nitride semiconductor crystal.

Next, as indicated in FIGS. 2 through 4, the template substrate 11 is set into place (Step S2). While the template substrate is not particularly limited, preferably it is a substrate having the identical atomic ratios as that of the nitride semiconductor crystal that is grown. The template substrate 11 is placed in the upper portion of the crucible 101. It should be understood that Step S2 may be omitted. In that case, the nitride semiconductor crystal is grown by spontaneous nucleation.

Next, the source material 17 is set into place (Step S3). While the source material 17 is not particularly limited, preferably its level of purity is high. For example, in an instance in which the nitride semiconductor crystal that is grown is AlN crystal, for the source material 17 a sintered AlN source material preferably is employed. In that case, a sintering promoter will not be included in the source material 17. The source material 17 is placed in the lower portion of the crucible 101 so that it and the template substrate 11 face each other.

Figure 5:
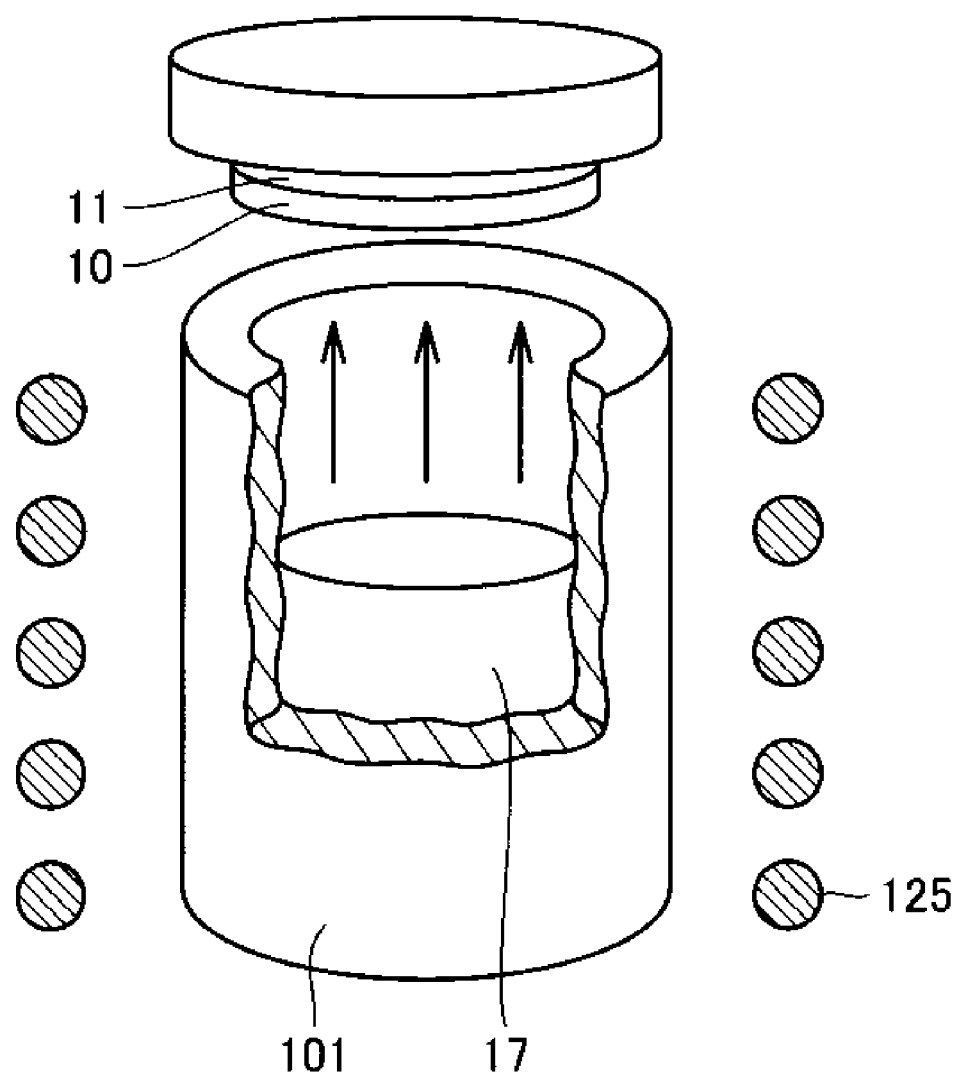
FIG. 5 is a partially fragmented sectional view illustrating, in a simplified form, a situation in which nitride semiconductor crystal is grown in a mode of embodying the present invention.

Next, as indicated in FIGS. 4 and 5, the source material 17 is heated, thereby subliming the material and, in the region inside the crucible 101 opposing the source material 17, depositing source-material gases, which grows nitride semiconductor crystal 10 (Step S4). In the present embodying mode, the nitride semiconductor crystal 10 is grown by the sublimed source-material gases being caused to deposit onto the template substrate 11.

In this Step S4, in implementations in which AlN crystal is grown as the nitride semiconductor crystal 10, the heating unit 125 is controlled, for example, so as to have the temperature along the template substrate 11 be 1400° C. to 1800° C., and so that the temperature along the source material 17 will be 1850° C. to 2150° C. In implementations in which GaN crystal is grown as the nitride semiconductor crystal 10, the heating unit 125 is controlled, for example, so as to have the temperature along the template substrate 11 be 1450° C. to 1550° C., and so that the temperature along the source material 17 will be 1600° C. to 1700° C.

In this Step S4, the carrier gas that is flowed along the inner periphery of the covering sleeve 110 (gas that is flowed from the inlet port 123c and is exhausted through the exhaust port 123d), and the carrier gas that is flowed along the outer periphery of the covering sleeve 110 (gas that is flowed from the inlet port 123a and is exhausted through the exhaust port 123b) may be the same, or they may be different. It is preferable that gaseous nitrogen be flowed along the inner periphery of the covering sleeve 110 within the reaction vessel 123, and that a gas other than gaseous nitrogen be flowed along the outer periphery of the covering sleeve 110 within the reaction vessel 123. As the gas flowed along the outer periphery of the covering sleeve 110, preferably an inert gas such as argon (Ar) is flowed. Such an implementation allows the generation of hydrogen cyanide (HCN) gas to be kept under control, therefore making hazardous-waste removal equipment unnecessary.

It should be noted that in implementations in which nitride semiconductor crystal 10 is grown employing a template substrate 11, a step of stripping away the template substrate 11 may be carried out.

By means of foregoing Steps S1 through S4, nitride semiconductor crystal 10 represented in FIG. 1 can be manufactured.

In the present embodying mode, the nitride semiconductor crystal 10 is grown with the covering sleeve 110 arranged about the outer periphery of the crucible 101 (Step S4). In sublimation method, since the nitride semiconductor crystal 10 is grown at high temperatures such as noted earlier, the materials (e.g., C, Si, etc.) constituting the heating element 121, the heat insulator 127, and the reaction vessel 123, located externally of the covering sleeve 110, are liable to sublime. Growing the nitride semiconductor crystal 10 in an environment in which the covering sleeve 110 is installed, however, allows immixing of sublimed impurities into the interior the crucible 101 to be kept under control.

Again, the first layer 111 formed in the covering sleeve 110 where it opposes the crucible 101 is made of a metal whose melting point is higher than that of the source material 17. The covering sleeve 110 may thereby be kept from subliming at the temperatures at which the source material 17 sublimes. And the metal's reactivity with the sublimation gases is low.

The first layer, located on the inner periphery of the covering component, may thereby be kept from reacting with the sublimation gases.

These factors keep impurities produced by subliming of the materials that constitute the covering sleeve 110 from invading the crucible 101.

In this way, by means of the covering sleeve 110, invasion of impurities from the exterior to the interior of the crucible 101 may be kept under control, and impurities generated from the covering sleeve 110 held to a minimum. Accordingly, immixing of impurities from outside the crucible 101 into the nitride semiconductor crystal 10 that is grown may be kept under control. Thus, nitride semiconductor crystal 10 in which immixing of impurities has been controlled to a minimum can be manufactured. Impurities may therefore be kept from mixing into the nitride semiconductor crystal 10 that is manufactured. And the fact that the nitride semiconductor crystal 10 is produced by sublimation method makes possible the manufacture of nitride semiconductor crystal 10 of large surface area. Nitride semiconductor crystal 10 for example having a diameter R of at least 10 mm, and having an impurity concentration of not greater than 2 ppm can be manufactured as a result.

Furthermore, formed about the outer periphery of the covering sleeve 110 is the second layer 112, which contains the metal constituting the first layer 111, and C. In the present embodying mode, the heating element 121, which contains C, is installed contacting the outer periphery of the second layer 112 of the covering sleeve 110. The second layer 112 makes it possible to mitigate the difference in thermal expansion coefficient between the heating element 121 and the first layer 111. That makes it possible to alleviate warp in the covering sleeve 110 between its inner peripheral side (where it opposes the crucible 101) and its outer peripheral side (where it opposes the heating element 121 and the heat insulator 127), whereby the occurrence of cracking in the covering sleeve 110 may be controlled to a minimum. Accordingly, nitride semiconductor crystal 10 can be grown with breakage of the covering sleeve 110 being minimized, even under the high-temperature conditions for subliming the source material 17. Thus, nitride semiconductor crystal 10 can be manufactured in an environment in which the durability has been improved.

It is especially preferable that the nitride semiconductor crystal 10 be grown utilizing a crucible 101 made from a metal whose melting point is higher than that of the source material 17. Since in that case sublimation of the crucible 101 itself can be kept under control, impurities stemming from the material constituting the crucible 101 may be kept from mixing into the nitride semiconductor crystal 10 that is grown. Accordingly, nitride semiconductor crystal 10 in which immixing of impurities has been controlled to a minimum can be manufactured.

Accordingly, nitride semiconductor crystal 10 of low impurity concentration, manufactured by a nitride semiconductor crystal manufacturing method and a manufacturing apparatus 100 of the present embodying mode can be ideally utilized as substrates for devices including, for example: optical devices such as light-emitting diodes and laser diodes; semiconductor electronic devices such as rectifiers, bipolar transistors, field-effect transistors, and high electron mobility transistors (HEMTs); field emitters; semiconductor sensors such as temperature sensors, pressure sensors, radiation sensors, and visible-ultraviolet photodetectors; and surface acoustic wave devices (SAW devices), vibrators, resonators, oscillators, microelectromechanical system (MEMS) parts, and piezoelectric actuators. In particular, since nitride semiconductor crystal 10 having few defects, low dislocation density, and superior light transmission characteristics may be manufactured, it is advantageously utilized in light-emitting semiconductor devices.

Embodiment 1

In the present embodiment, the effectiveness of manufacturing nitride semiconductor crystal utilizing a covering sleeve including a first layer made of a metal whose melting point is higher than that of the source material was investigated.

Present Invention Example 1

Nitride semiconductor crystal 10 of Present Invention Example 1 was manufactured utilizing the manufacturing apparatus 100 represented in FIGS. 1 and 2, in accordance with the embodying mode explained above.

Specifically, to begin with, a manufacturing apparatus 100 comprising a crucible 101, a covering sleeve 110 including first and second layers 111 and 112, a heating element 121, a heat insulator 127, and a reaction vessel 123 was prepared (Step S1). The crucible 101 had an outer diameter of 1 inch, had a height of 1.5 inches, and was constituted from Ta. The covering sleeve 110 had an inner diameter of 30 mm, had an outer diameter of 32 mm, had a height of 500 mm, and was made up of the first layer 111 and the second layer 112. The first layer 111, located along the inner periphery, was constituted from Ta. The second layer 112, disposed on the outer periphery of the first layer 111, was formed by carbonizing the outer peripheral face of the first layer at 2000° C., and was constituted from TaC in which Ta:C=1:1. The heating element 121 was constituted from graphite, the heating component 125 was constituted from an RF coil, and the heat insulator 127 was constituted from carbon felt. And for the reaction vessel 123 a quartz tube was used.

Next, AlN as the source material 17 was set into place in the interior of the crucible 101 (Step S3). The melting point of Ta, the material constituting the crucible 101 and the first layer 111 of the covering sleeve 110, is 2990° C. while the melting point of AlN, the source material, is 2200° C., wherein the melting point of the crucible 101 and the first layer 111 was higher than the melting point of the source material 17.

Next, an AlN substrate as the template substrate 11 was arranged in the interior of the crucible 101 so as to oppose the source material 17 (Step S2).

Next, gaseous $N_2$ as a carrier gas was flowed, and under a $N_2$ atmosphere, with the growth temperature being 2000° C., AlN crystal as the nitride semiconductor crystal 10 was grown (Step S4).

After being cooled, the AlN crystal of Present Invention Example 1 was taken out from the manufacturing apparatus 100. The result was that Present Invention Example 1 AlN crystal with a diameter R of 10 mm and a thickness H of 1 mm had been formed onto the template substrate 11.

Comparative Example 1

Nitride semiconductor crystal of Comparative Example 1 was manufactured in a way that was basically the same as that of Present Invention Example 1, but that differed in that the material constituting the crucible 101 was carbon, and in that a covering sleeve 110 was not installed.

Figure 6:
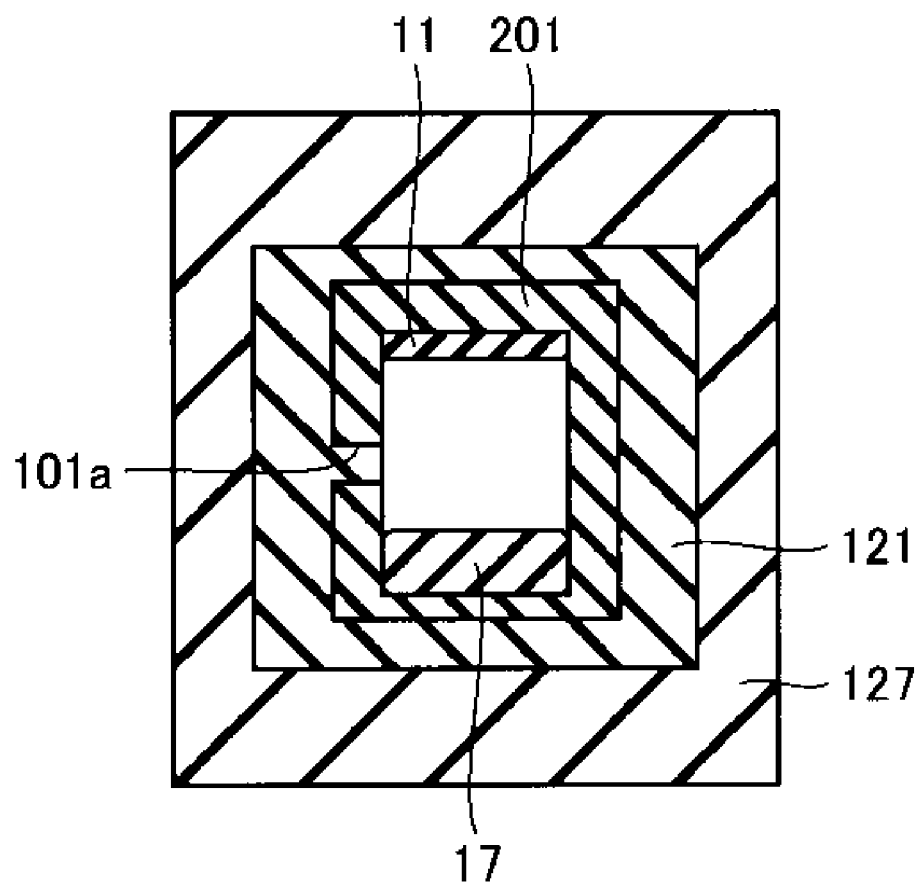
FIG. 6 is an enlarged sectional diagram representing, in a simplified form, a nitride semiconductor crystal manufacturing apparatus of first and second comparative examples.

Specifically, AlN crystal of Comparative Example 1 was manufactured employing the manufacturing apparatus depicted in FIG. 6. That is, the manufacturing apparatus employed in Comparative Example 1 was furnished with a carbonous crucible 201, a heating element 121 covering the outer periphery of the crucible 201, and a heat insulator 127 covering the outer periphery of the heating element 121. Comparative Example 1 AlN crystal having a thickness of 1 mm was thereby produced onto the template substrate 11.

Comparative Example 2

Nitride semiconductor crystal of Comparative Example 2 was manufactured in a way that was basically the same as that of Present Invention Example 1, but that differed in that the material constituting the crucible 101 was TaC, and in that a covering sleeve 110 was not installed.

Specifically, in the manufacturing apparatus depicted in FIG. 6, employed in Comparative Example 1, a crucible consisting of TaC, in which the material of the crucible 101 was Ta:C=1:1, was employed. Comparative Example 2 AlN crystal having a thickness of 1 mm was thereby produced onto the template substrate 11.

Measurement Method

SIMS (secondary ion mass spectroscopy) was employed to measure the Si concentration, C concentration and O concentration as the impurity concentration in the AlN crystal of Present Invention Example 1, and Comparative Examples 1 and 2. The results are set forth in Table I below.

TABLE I

|  | C conc. | Si conc. | O conc. | Impurity conc. |
| --- | --- | --- | --- | --- |
| Pres. Invent. Ex. 1 | 1 ppm or less | 1 ppm or less | 0 ppm | 2 ppm or less |
| Comp. Ex. 1 | 10 ppm | 10 ppm | 0 ppm | 20 ppm |
| Comp. Ex. 2 | 5 ppm | 5 ppm | 0 ppm | 10 ppm |

Measurement Results

As indicated in Table I, in the AlN crystal of Present Invention Example 1, which was manufactured utilizing a covering sleeve 110 comprising a first layer 111 made from a metal that did not contain C and whose melting point was higher than that of the source material 17, the C concentration and Si concentration were each not greater than 1 ppm, while the impurity concentration was, at not greater than 2 ppm, extraordinarily low.

On the other hand, in the AlN crystal of Comparative Example 1, which was manufactured employing a manufacturing apparatus not furnished with the covering sleeve 110, the C concentration and Si concentration were 10 ppm, and the impurity concentration, at 20 ppm, was extraordinarily high.

In the AlN crystal of Comparative Example 2, which was also manufactured employing a manufacturing apparatus not furnished with the covering sleeve 110, since a crucible made from TaC was employed, although the C concentration, Si concentration, and impurity concentration were lower than those of the AlN crystal of Comparative Example 1, they were all higher than the impurity concentration of the AlN crystal of Present Invention Example 1.

As far as the carbon is concerned, the material constituting the crucible 201, the heating element 121, and the heat insulator 127 sublimed and, through the exhaust port 101a in the crucible 101, mixed into the AlN crystal. As far as the silicon is concerned, the material constituting the reaction vessel 123 sublimed and, through the exhaust port 101a in the crucible 101, mixed into the AlN crystal. Consequently, from the results with the carbon concentration and the silicon concentration, it was understood that by furnishing the apparatus with the covering sleeve 110, the impurity concentrations each could be reduced. And from the results with the carbon concentration, it was understood that by making the material that constitutes the crucible 101 be a metal whose melting point is higher than that of the source material, the C concentration could be reduced.

Therein, the inventors gained the insight that if the crucible 101 interior is completely sealed shut without providing the crucible 101 with the exhaust port 101a, the crystal will grow abnormally, without growing into single crystal. Therefore, it is necessary that an exhaust port 101a be formed in the crucible 101. Accordingly, it was understood that by furnishing the apparatus with the exhaust port 101a in the crucible 101, and with the exhaust port 123d in between the crucible 101 and the covering sleeve 110, the impurity concentration could be reduced in the manufacture of AlN crystal that does not grow abnormally.

From the foregoing it could be confirmed that according to the present embodiment, utilizing a manufacturing apparatus 100 in which a covering sleeve 110 comprising a first layer 111 made of a metal whose melting point is higher than that of the source material 17 is formed alongside, in opposition to, the crucible 101, to manufacture AlN crystal as nitride semiconductor crystal 10 made it possible to reduce the concentration of impurities contained in the manufactured AlN crystal.

In the present embodiment, an explanation was made with AlN crystal being given as an example of nitride semiconductor crystal 10. Nevertheless, with regard to nitride semiconductor crystal 10 other than AlN crystal, by utilizing the covering sleeve 110 comprising the first layer 111, impurities may be kept from invading from the exterior to the interior of the covering sleeve 110. With further regard also to nitride semiconductor crystal 10 other than AlN crystal, by rendering the material constituting the first layer 111 in the same manner, the first layer 111 may be kept from subliming at the temperatures that sublime the source material 17. Furthermore, the metal's reactivity with the sublimation gases is low. Therefore, also with regard to nitride semiconductor crystal 10 other than AlN crystal, impurities may likewise kept from invading the crucible 101 interior from outside the covering sleeve 110 and from the covering sleeve 110 itself. Accordingly, in the same way as with Embodiment 1, nitride semiconductor crystal 10 in which immixing of impurities has been minimized can be manufactured.

Embodiment 2

In the present embodiment the effectiveness of manufacturing nitride semiconductor crystal utilizing a covering sleeve including a first layer formed along the sleeve where it opposes the crucible, and made of a metal whose melting point is higher than that of the source material, and a second layer formed along the outer periphery of the first layer, and made of a carbide of the metal that constitutes the first layer was investigated.

Specifically, the manufacturing apparatus of Present Invention Example 1, explained in Embodiment 1, and the following manufacturing apparatuses of Present Invention Example 2, Comparative Example 3 and Comparative Example 4 were employed to investigate durability.

Present Invention Example 2

The manufacturing apparatus of Present Invention Example 2 was basically the same as the manufacturing apparatus of Present Invention Example 1, but a manufacturing apparatus furnished with a covering sleeve 110 in which the method whereby the second layer 112 was formed differed was utilized. Specifically, a first layer 111 constituted from Ta, and a second layer 112 constituted from TaC in which Ta:C=1:1 were prepared. Thereafter the second layer 112 was fit over the first layer 111 in such a way that the second layer 112 jacketed the outer periphery of the first layer 111.

Present Invention Example 3

The manufacturing apparatus of Present Invention Example 3 was basically the same as the manufacturing apparatus of Present Invention Example 1, but a manufacturing apparatus furnished with a covering sleeve 110 in which the method whereby the second layer 112 was formed differed was utilized. Specifically, in the first layer 111 only the heating-unit proximity was carbonized. The covering sleeve 110 of the manufacturing apparatus of Present Invention Example 3 comprised a first layer 111, and a second layer 112 jacketing the outer periphery of the first layer 111, with the second layer 112 being formed along the outer periphery of the first layer 111 only in the heating-unit proximity.

Comparative Example 3

Figure 7:
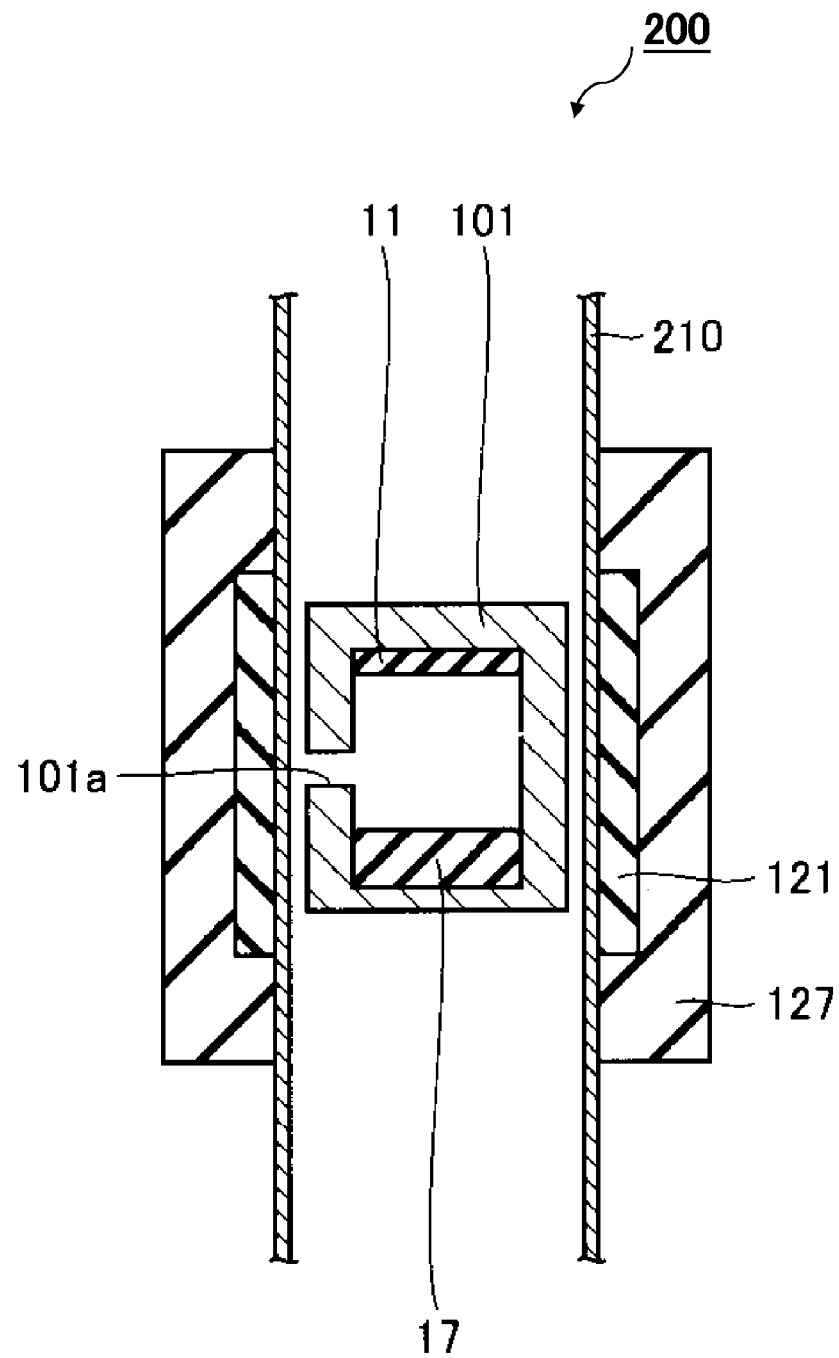
FIG. 7 is an enlarged sectional diagram representing, in a simplified form, a nitride semiconductor crystal manufacturing apparatus of third and fourth comparative examples.

The manufacturing apparatus of Comparative Example 3 was basically the same as the manufacturing apparatus of Present Invention Example 1, but differed in that a manufacturing apparatus 200, represented in FIG. 7, furnished with a unilaminar covering sleeve 210 constituted from tantalum carbide was employed. That is, a first layer 111, constituted from Ta, alone was prepared and carbonized at 2000° C., whereby a covering sleeve 210 constituted from TaC in which Ta:C=1:1 was created.

Comparative Example 4

The manufacturing apparatus of Comparative Example 4 was basically the same as the manufacturing apparatus of Present Invention Example 1, but differed in that a manufacturing apparatus 200, represented in FIG. 7, furnished with a unilaminar covering sleeve 210 constituted from tantalum was employed. That is, the covering sleeve 210 was rendered by preparing a first layer 111, constituted from Ta, alone.

Measurement Method

Each of the manufacturing apparatuses of Present Invention Examples 1 through 3, and Comparative Example 3 and Comparative Example 4 was heated to 2200° C., and the presence/absence of occurrences of fracturing in the covering sleeves after 20 hours, after 50 hours, after 100 hours, and after 200 hours was investigated. The results are set forth in Table II below. In Table II, cases where there were no cracks in the covering sleeve are entered as "unbroken," while cases where there were cracks or damage in the covering sleeve are entered as "broken."

TABLE II

|  | Structure | Carbonizing | At 20 hours | At 50 hours | At 100 hours | At 200 hours |
| --- | --- | --- | --- | --- | --- | --- |
| Pres. Invent. Ex. 1 | Bilaminar | Yes (overall) | unbroken | unbroken | unbroken | unbroken |
| Pres. Invent. Ex. 2 | Bilaminar | No | unbroken | unbroken | broken | broken |
| Pres. Invent. Ex. 3 | Bilaminar | Yes (heating-unit proximity only) | unbroken | unbroken | unbroken | unbroken |
| Comp. Ex. 3 | Unilaminar | Yes (overall) | unbroken | broken | broken | broken |
| Comp. Ex. 4 | Unilaminar | No | broken | broken | broken | broken |

Measurement Results

As indicated in Table II, with the manufacturing apparatuses of Present Invention Examples 1 through 3, furnished with a covering sleeve comprising a first layer formed along the sleeve where it opposes the crucible, and made of a metal whose melting point is higher than that of the source material, and a second layer formed along the outer periphery of the first layer, and made of a carbide of the metal that constitutes the first layer, even after 50 hours or more had elapsed, fracturing had not occurred.

In particular, with Present Invention Examples 1 and 3, in which the second layer was formed by a carbonizing process, even in the case of heating for 200 hours, fracturing had not occurred in the covering sleeve 110. This was on account of being able to effectively mitigate difference in thermal expansion coefficient with the heating element because increase in C heading from the inner peripheral side to the outer peripheral side was gentler than in the covering sleeve of Present Invention Example 2.

And Present Invention Example 3, in which the second layer was formed only in the heating-unit proximity, had the same effectiveness as Present Invention Example 1, in which the second layer was formed on the area other than the heating-unit proximity (that is, on the entirety of the first layer). It was therefore understood that forming the second layer at least in the heating-unit proximity is satisfactory.

On the other hand, with the manufacturing apparatuses of Comparative Examples 3 and 4, furnished with a covering sleeve 210 consisting of a single layer only, at 20 hours and 50 hours, fracturing and damage had occurred in each.

From the foregoing it could be confirmed that according to the present embodiment, furnishing a manufacturing apparatus 100 with a covering sleeve 110 comprising a first layer 111 formed on the side opposing the crucible 101, and made of a metal whose melting point is higher than that of the source material 17, and a second layer 112 formed along the outer periphery of the first layer 111, and made of a carbide of the metal constituting the first layer 111 allowed the durability of the covering sleeve 110—i.e., the durability of the apparatus—to be improved. In particular, it could be confirmed that at the 2200° C. high temperature that is required in order to manufacture AlN crystal, a manufacturing apparatus 100 of the present invention will be durable.

Embodiment 3

In the present embodiment the effectiveness, in a manufacturing apparatus furnished with a covering component, of flowing a gas that does not contain nitrogen along the outer periphery of the covering component was investigated.

Samples 1 Through 3

With Samples 1-3 in the present embodiment, AlN crystal was manufactured basically utilizing the manufacturing apparatus 100 of Present Invention Example 1, but differed in that as the carrier gas, gaseous $N_2$ was flowed along the inner periphery of the covering sleeve 110 within the reaction vessel 123, and gaseous helium (He), gaseous neon (Ne) and gaseous Ar were respectively flowed along the outer periphery of the covering sleeve 110 within the reaction vessel 123.

In the manufacture of each of the AlN crystals, in which each of the carrier gases was flowed, the hydrogen-cyanide gas concentration inside the reaction vessel 123 was measured with a hydrogen-cyanide gas sensor. In turn, in the manufacture of AlN crystal in Present Invention Example 1, in which gaseous $N_2$ was flowed along both the outer periphery and along the inner periphery of the covering sleeve 110, the hydrogen-cyanide gas concentration inside the reaction vessel 123 was measured in the same manner. The results are set forth in Table III.

TABLE III

| | Gas on covering-sleeve outer periphery | | | |
|---|---|---|---|---|
| | N$_2$ (Pres. Invent. Ex. 1) | He (Sample 1) | Ne (Sample 2) | Ar (Sample 3) |
| Hydrogen-cyanide gas conc. | 30 ppm | Less than 1 ppm | Less than 1 ppm | Less than 1 ppm |

As indicated in Table III, in the samples in which an inert gas other than nitrogen was flowed along the outer periphery of the covering component, the concentration of hydrogen cyanide gas generated in the manufacture of the AlN crystal proved to be less than 1 ppm; hydrogen cyanide gas was scarcely generated. On the other hand, in the sample in which nitrogen was flowed along the outer periphery of the covering component, 30 ppm of hydrogen cyanide gas was detected. Consequently, it was understood that flowing an inert gas other than nitrogen along the outer periphery of the covering component allowed hazardous-waste removal equipment for clearing away any hydrogen-cyanide gas hazard to be omitted.

From the foregoing, it could be confirmed that according to the present embodiment, in a manufacturing apparatus furnished with a covering component, flowing a gas other than nitrogen along the outer periphery of the covering component allowed the manufacturing apparatus to be simplified.

While a description of embodying modes and embodiment examples of the present invention has been undertaken in the foregoing manner, combining the features of each of the embodying modes and embodiment examples to suit is contemplated from the outset. Furthermore, the presently disclosed embodying modes and embodiment examples should in all respects be considered to be illustrative and not limiting. The scope of the present invention is set forth not by the foregoing embodying modes and embodiment examples but by the scope of the claims, and is intended to include meanings equivalent to the scope of the claims and all modifications within the scope.

Reference Signs List

10: nitride semiconductor crystal; 11: template substrate; 17: source material; 100: manufacturing apparatus; 101: crucible; 101a: exhaust port; 110: covering sleeve; 111: first layer; 112: second layer; 121: heating element; 123: reaction vessel; 123a, 123c: inlet ports; 123b, 123d: exhaust ports; 125: heating unit; 127: heat insulator; 129a, 129b: pyrometers; H: thickness; R: diameter

The invention claimed is:

1. A nitride semiconductor crystal manufacturing apparatus whereby a nitride-semiconductor-containing source material is sublimed and nitride semiconductor crystal is grown by the deposition of the sublimed source-material gases, the apparatus comprising:
   a reaction vessel having a pair of inlet ports at one end and a pair of exhaust ports at an end opposite the inlet-port end;
   a crucible, disposed within said reaction vessel, for interiorly carrying source material, said crucible being free of carbon atoms and made of a metal whose melting point is higher than that of the source material;
   a heating unit disposed about the outer periphery of the crucible, for heating the crucible interior;
   a bilaminar covering component arranged spaced apart from said crucible, in between said crucible and said heating unit and hermetically closing off said crucible within said reaction vessel except at one of said inlet ports and one of said exhaust ports, such that the other one of said inlet ports and the other one of said exhaust ports are disposed outside said covering component; and
   an inert carrier gas, selected from helium, neon and argon, flowing within said reaction vessel along said covering component outer peripherally; wherein
   said covering component includes a first layer formed along a covering-component side opposing said crucible, and made of a metal whose melting point is higher than that of the source material, and a second layer formed along the outer periphery of said first layer, and made of a carbide of the metal that constitutes said first layer; and
   the thermal expansion coefficient of said covering component monotonically decreases heading from its inner periphery to its outer periphery.

2. The nitride semiconductor crystal manufacturing apparatus set forth in claim 1:
   said heating unit being an RF coil; therein further comprising
   a heating element arranged in between said covering component and said heating unit.

3. The nitride semiconductor crystal manufacturing apparatus set forth in claim 2, further comprising a heat insulator, disposed in between said heating element and said RF coil, and consisting of a material that is less porous than said heating element is.

* * * * *